United States Patent
Cheng et al.

(10) Patent No.: US 7,745,267 B2
(45) Date of Patent: Jun. 29, 2010

(54) METHOD OF FABRICATING ACTIVE LAYER OF THIN FILM TRANSISTOR

(75) Inventors: Hsiang-Yuan Cheng, Taipei (TW); Shin-Chuan Chiang, Taipei (TW); Shih-Hsiang Lai, Taipei County (TW); Chin-Chih Yu, Hsinchu (TW); Bor-Chuan Chuang, Tainan County (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, Taipei County (TW); Chi Mei Optoelectronics Corporation, Tainan County (TW); Industrial Technology Research Institute, Hsinchu (TW); TPO Dispalys Corp., Miao-Li County (TW)

( * ) Notice: Subject to any disclaimer, the term of this patent is extended or adjusted under 35 U.S.C. 154(b) by 719 days.

(21) Appl. No.: 11/614,977

(22) Filed: Dec. 22, 2006

(65) Prior Publication Data
US 2008/0057631 A1 Mar. 6, 2008

(30) Foreign Application Priority Data

Sep. 4, 2006 (TW) .............................. 95132538 A
Nov. 7, 2006 (TW) .............................. 95141133 A

(51) Int. Cl.
*H01L 21/00* (2006.01)

(52) U.S. Cl. ................ 438/149; 438/151; 257/E29.151

(58) Field of Classification Search ......... 438/149–151, 438/785; 257/E29.151
See application file for complete search history.

(56) References Cited

U.S. PATENT DOCUMENTS 7,402,506 B2 * 7/2008 Levy et al. ................... 438/584
2008/0129178 A1 * 6/2008 Hudspeth et al. ............ 313/309

FOREIGN PATENT DOCUMENTS

JP        2004300226       * 10/2004
TW         200512940          4/2005

OTHER PUBLICATIONS

L. Znaidi et al. "Oriented ZnO thin films synthesis by sol el process for laser application." Thin Solid Films 428 (2003), 2002 Elsevier Science B.V., pp. 257-262.
D. Basak et al. "Photoconductive UV detectors on sol-gel-synthesized ZnO films." Journal of Crystal Growth 256 (2003), 2003 Elsevier Science B. V., pp. 73-77.

(Continued)

*Primary Examiner*—Thanh Nguyen
(74) *Attorney, Agent, or Firm*—Jianq Chyun IP Office

(57) ABSTRACT

A manufacturing method of an active layer of a thin film transistor is provided. The method includes following steps. First a substrate is provided, and a semiconductor precursor solution is then prepared through a liquid process. Thereafter, the semiconductor precursor solution is provided on the substrate to form a semiconductor precursor thin film. After that, a light source is used to irradiate the semiconductor precursor thin film to remove residual solvent and allow the semiconductor precursor thin film to produce semiconductor property, so as to form a semiconductor active layer.

10 Claims, 2 Drawing Sheets

OTHER PUBLICATIONS

Eunice S. P. et al. "Sol-Gel ZnO-SiO2 Composite Waveguide Ultraviolet Lasers." IEEE Photonics Technology Letters vol. 16, No. 11, Nov. 2004, pp. 2418-2420.

T. Nagase et al. "A novel approach to prepare zinc oxide films: excimer laser irradiation of sol-gel derived precursor films." Thin Solid Films 357 (1999). 1999 Elsevier Sciences S. A., pp. 151-158.

Steven K. Volkman et al. "A novel transparent air-stable printable n-type semiconductor technology using ZnO nanoparticles." 2004 IEEE. pp. 32.1.1-32.1.4.

Jen Hao Lee et al. "Chemical Solution Deposition of Zn1-xZrxO Thin Films as Active Channel Layers of Thin-Film Transistors." Electrochemical and Solid-State Letters. 9(4), pp. G117-G120 (2006).

Kazuyuki Hayashi et al. "Crystallization of Sol-Gel Derived Precursor Zinc Oxide Film during KrF Excimer Laser Irradiation." Proc. of SPIE vol. 4830 (2003), pp. 296-300.

Shou-Yi Kuo et al. "Investigation of annealing-treatment on the optical and electrical properties of sol-gel-derived zinc oxide thin film" Superlattices and Microstructures 39 (2006), pp. 162-170, available online Sep. 12, 2005 Elsevier Ltd.

Toshimi Nagase et al. "Morphology, Structure and Photoluminescence Properties of Zinc Oxide Films Prepared by Excimer Laser Irradiation of Sol-Gel-Derived Precursors" Jpn. J. Appl. Phys. vol. 40 (2001) pp. 6296-6303.

Jen Hao Lee et al. "Sol-Gel-Derived Zn(1-x)MgxO Thin Films Used as Active Channel Layer of Thin-Film Transistors." Japanese Journal of Applied Physics vol. 44, No. 7A, 2005, pp. 4784-4789.

B J Norris et al. "Spin-coated zinc oxide transparent transistors" J. Phys. D: Appl. Phys. 36 (2003), pp. L105-L107. 2003 IOP Publishing Ltd.

Hua-Chi Cheng et al. "Thin-film transistors with active layers of zinc oxide (ZnO) fabricated by low-temperature chemical bath method" Thin Solid Films 498 (2006), Elsevier B.V. pp. 142-145.

\* cited by examiner

METHOD OF FABRICATING ACTIVE LAYER OF THIN FILM TRANSISTOR

CROSS-REFERENCE TO RELATED APPLICATION

This application claims the priority benefit of Taiwan application serial no. 95132538, filed Sep. 4, 2006 and Taiwan application serial no. 95141133, filed Nov. 7, 2006. All disclosure of the Taiwan applications is incorporated herein by reference.

BACKGROUND OF THE INVENTION

1. Field of the Invention

The present invention relates to a thin film transistor and a method of fabricating an active layer thereof. More particularly, the present invention relates to a method of fabricating an active layer which can be directly performed in atmospheric air, a thin film transistor having the active layer, and a liquid crystal display.

2. Description of Related Art

Amorphous silicon transistor and low temperature polycrystalline transistor are the two major thin film transistors in today's active flat panel displays. However, since vacuum coating and photolithography processes are required for manufacturing such transistors, the cost of equipment, material, and process are substantially high. In particular, when the size of substrate gets larger and larger, how to reduce the manufacturing cost of these transistors becomes an important issue.

Accordingly, the research and development of new thin film transistor technique has been focused, wherein the method of fabricating thin film transistor using liquid process has become today's major subject. In recent years, methods of manufacturing II-VI compound, for example, ZnO, thin film transistor using liquid process is quick and simple, besides, no vacuum equipment is required for such processes. Thus, the manufacturing cost of thin film transistor can be reduced considerably. Moreover, the use of amorphous silicon transistor greatly improves the performance of the device, accordingly, the advantage of applying thin film transistor to low-cost and large-size product is greatly increased.

Regarding ZnO semiconductor, the existing methods for manufacturing thin film transistor with ZnO precursor solution is capable of evenly distributing ZnO nano particles in solvent, or the ZnO sol-gel solution is coated on a substrate by using a conventional method first, and then the residual solvent may be removed through conventional thermal process. Finally, recrystallization is performed. Good device characteristics can be obtained by using these methods. However, as the process temperatures are usually higher than 500° C., which may increase the manufacturing cost and adversely affect the throughput.

SUMMARY OF THE INVENTION

Accordingly, the present invention is directed to a cost effective method of fabricating an active layer of a thin film transistor.

According to another aspect of the present invention, a thin film transistor having an active layer is provided, wherein the active layer can be manufactured in atmospheric environment under room temperature.

According to yet another aspect of the present invention, a liquid crystal display having the foregoing thin film transistor is provided.

The present invention provides a method of fabricating an active layer of a thin film transistor. First, a substrate is provided, and a semiconductor precursor solution is then prepared. Next, the semiconductor precursor solution is applied on the substrate to form a semiconductor precursor thin film thereon. After that, a light source is used to irradiate the semiconductor precursor thin film to remove residual solvent in the semiconductor precursor thin film to transform the semiconductor precursor thin film into a semiconductor active layer having semiconductor property.

The present invention further provides a thin film transistor including a substrate, a gate, a source/drain, an insulating layer, and a semiconductor active layer. The gate and the source/drain are respectively deposited on the substrate and are separated by the insulating layer on the substrate. The semiconductor active layer connects the source and the drain. The material of the semiconductor active layer is a semiconductor precursor which posses semiconductor property after being irradiated by a light source.

The present invention further provides a liquid crystal display including a display substrate, a counter substrate, and a liquid crystal layer disposed between the display substrate and the counter substrate. The display substrate includes a first substrate, a first electrode layer deposited on the first substrate, a foregoing thin film transistor deposited on the first substrate and electrically connected to the first electrode layer, and a first alignment film deposited on the first electrode layer. The counter substrate includes a second substrate, a second electrode layer deposited on the second substrate, and a second alignment film disposed on the second electrode layer.

According to the present invention, a predetermined portion of the transistor is irradiated directly or through a mask with a light source of appropriate wavelength and energy, so as to remove organic bonding within the irradiated area of the semiconductor precursor through light-heat function, and transform the semiconductor precursor into a semiconductor material. Accordingly, direct patterning can be accomplished by the method of the present invention. Moreover, since no vacuum equipment, conventional photolithography or conventional high-temperature thermal process using semiconductor crystal is required in the manufacturing process of the present invention, the manufacturing cost can be substantially reduced and the manufacturing process can also be substantially simplified.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
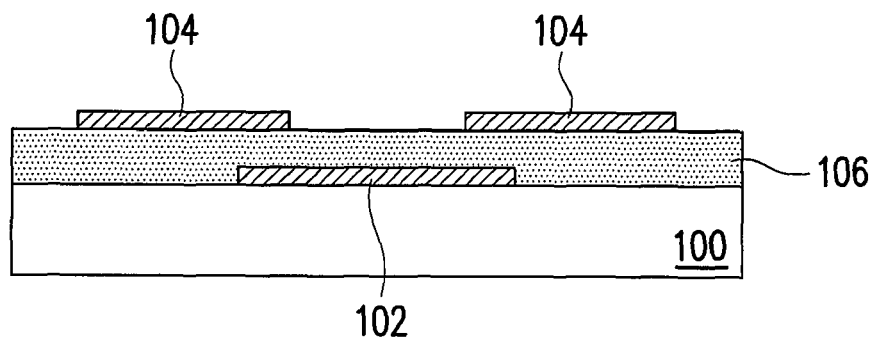
FIGS. 1A~1C are cross-sectional views illustrating the manufacturing flow of an active layer of a thin film transistor according to the first embodiment of the present invention.
Figure 1B:
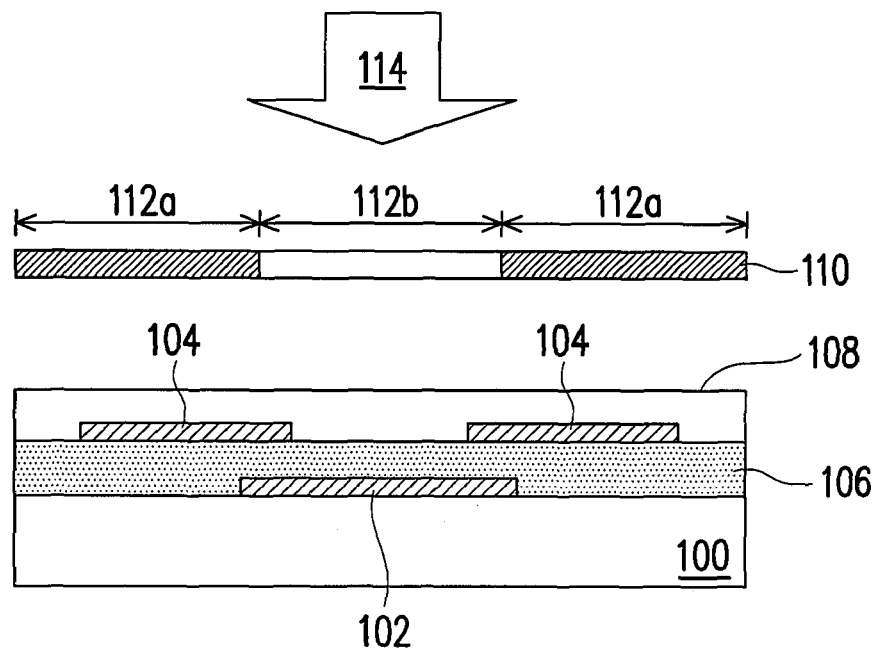
Figure 1C:
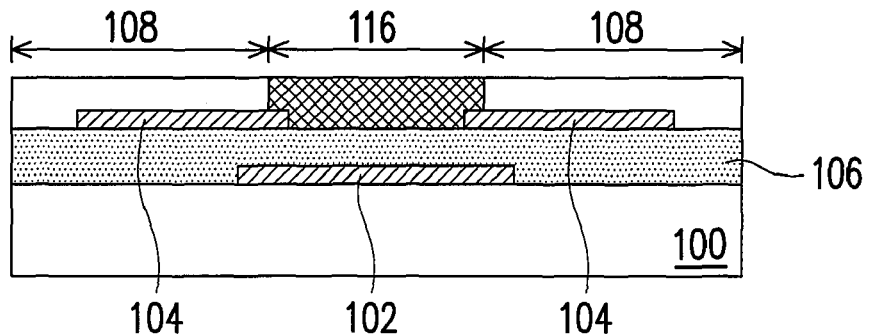

FIGS. 1A~1C are cross-sectional views illustrating the manufacturing flow of an active layer of a thin film transistor according to the first embodiment of the present invention.

Referring to FIG. 1A, a substrate 100 having a gate 102 and a source/drain 104 formed thereon is provided, and an insulating layer 106 which separates the gate 102 and the source/drain 104 is further deposited on the substrate 100. For the application to low cost and large size product, the substrate 100 may be a Si wafer, a glass substrate, a ceramic substrate, a metal substrate, a paper substrate, or a plastic substrate. The gate 102 and the source/drain 104 may be comprised of metal material, transparent conductive material, and organic conductive material, wherein the metal material may be Al, Cu, Mo, Ag, or Au, the transparent conductive material may be indium tin oxide (ITO) or antimony tin oxide (ATO), and the organic conductive material may be poly(3,4-ethylene dioxythiophene) (PEDOT). The insulating layer 106 may include organic insulating material such as poly(vinyl pyrrolidone) (PVP), polyvinyl alcohol (PVA), poly(methyl methacrylate) (PMMA), and polyimide (PI), or inorganic insulating material such as SiOx, SiNx, LiF, and $Al_2O_3$. Even though only a bottom-gate thin film transistor is illustrated in the figures of the first embodiment, the present invention may also be applied to other types of thin film transistors, such as a top-gate thin film transistor.

Referring to FIG. 1B, a semiconductor precursor solution is then prepared through a liquid process which may be sol-gel, chemical bath deposition, photo-chemical deposition, or evenly distributing suitable semiconductor nano particles into a solvent. After that, the semiconductor precursor solution is provided on the substrate 100 to form a semiconductor precursor thin film 108, and the method used herein may be spin-coating, inkjet printing, drop-printing, casting, micro-contact, micro-stamp, or dipping. The material of the semiconductor precursor thin film 108 may be II-VI compound semiconductor precursor, and other II-VI compound semiconductor precursors may also be used besides ZnO adopted in following embodiments. Here a soft baking step is performed selectively to remove organics in the semiconductor precursor solution.

Referring to FIG. 1B again, a light source 114 is used to irradiate the semiconductor precursor thin film 108 to remove residual solvent in the semiconductor precursor thin film 108 and transform the semiconductor precursor thin film 108 into a semiconductor layer having semiconductor property. In this embodiment, the light source 114 has a wavelength between 5 nm and 750 nm and an energy density between 0.01 mj/cm$^2$ and 1200 mj/cm$^2$. For example, the light source 114 may be KrF excimer laser of 248 nm, H-20 UV (referring to Journal of CRYSTAL GROWTH 256 (2003) pages 73-77, titled as "Photoconductive UV detectors on sol-gel-synthesized ZnO films") between 300 nm and 750 nm, Nd:YAG laser (referring to IEEE Photonics Technology Letters, Vol. 16, No. 11 (November, 2004) pages 2418-2420, titled as "Sol-Gel ZnO—$SiO_2$ Composite Waveguide Ultraviolet Lasers") of 355 nm, or other light sources of suitable wavelengths. Besides, to accomplish patterned effect, a mask 110 composed of a non-transmissive region 112a and a transmissive region 112b may be provided as a mask before irradiating the semiconductor precursor thin film 108 with the light source 114.

Referring to FIG. 1C, the semiconductor precursor thin film 108 irradiated by the light source (the light source 114 in FIG. 1B) then transforms into a semiconductor active layer 116. In an embodiment of the present invention, the semiconductor precursor thin film 108 that is not irradiated by the light source can be removed selectively and the solvent used for preparing the semiconductor precursor solution can be used directly so that no photolithography process is required.

The actual procedure of the first embodiment will be described in following example.

Example

In this example, the zinc oxide (ZnO) sol-gel solution is prepared with sol-gel. First, 100 ml 2-methoxyethanol and 3.62 ml monoethanol amine (MEA) are mixed into a mixture solution, and then 13.2 g zinc acetate is dissolved into the mixture solution. The mixture solution is stirred for 30 minutes at 60° C. to be confectioned into a ZnO precursor solution.

After that, the foregoing ZnO precursor solution is formed on a glass substrate through spin-coating having an ITO gate (~1 kÅ) and a source/drain (~1 kÅ) a layer of $SiO_2$ has been deposited between the gate and the source/drain serving as an insulating layer (~3 kÅ) formed thereon. Next, a step of soft baking is performed at 200° C. to transform the ZnO precursor solution into a ZnO thin film. Eventually, a KrF excimer laser having a wavelength of 248 nm is used for irradiating the ZnO thin film over the device channel (the area between the source and the drain) through a mask to remove organic bonding in the ZnO thin film and to transform the ZnO from insulative into semiconductive, so as to obtain the desired thin film transistor.

When the voltage at the gate of the thin film transistor is 100V and the voltage at the drain thereof is also 100V, the current on/off ratio of the ZnO thin film transistor is $10^3$, and the carrier mobility thereof is $1.81 \times 10^{-4}$ cm$^2$/Vs.

Figure 2:
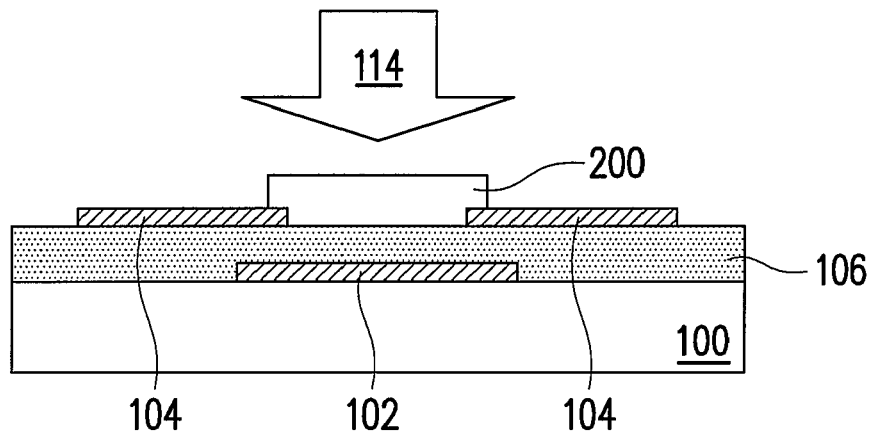
FIG. 2 is a cross-sectional view illustrating the method of fabricating an active layer of a thin film transistor according to the second embodiment of the present invention.

FIG. 2 is a cross-sectional view illustrating the fabrication process of an active layer of a thin film transistor according to the second embodiment of the present invention, wherein the same reference numerals as those in the first embodiment are used.

Referring to FIG. 2, the difference of FIG. 2 from the first embodiment is that the semiconductor precursor thin film 200 with a desired pattern may be formed using, such as inkjet printing, drop-printing, casting, micro-contact, or micro-stamp. Accordingly, no mask is required for irradiating the semiconductor precursor thin film 200 with the light source 114.

Figure 3:
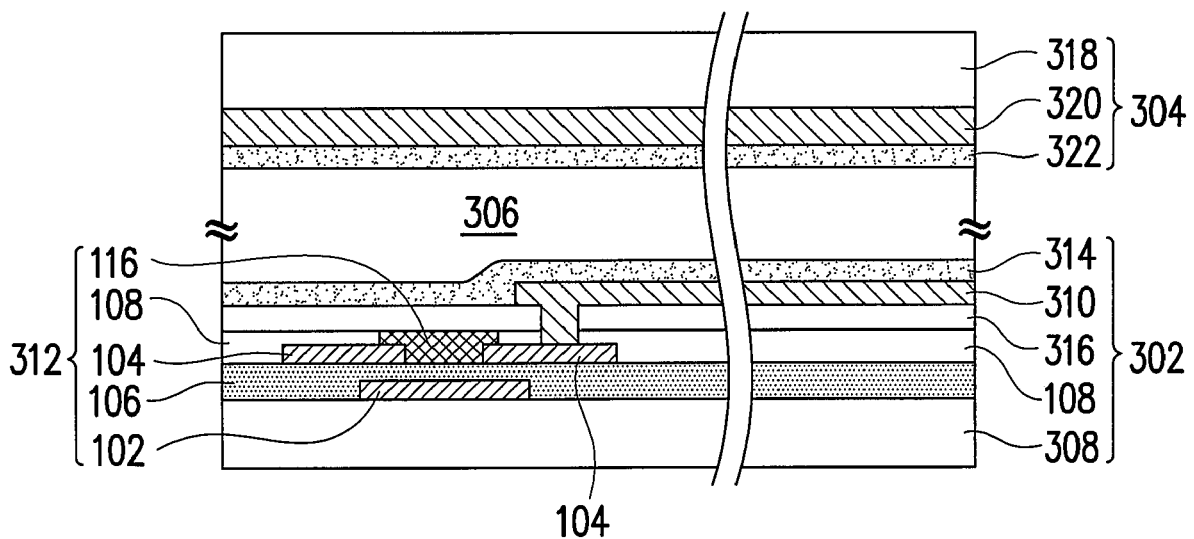
FIG. 3 is a cross-sectional view illustrating the structure of a liquid crystal display according to the third embodiment of the present invention.

FIG. 3 is a cross-sectional view illustrating the structure of a liquid crystal display according to the third embodiment of the present invention.

Referring to FIG. 3, in the present embodiment, the liquid crystal display includes a display substrate 302, a counter substrate 304, and a liquid crystal layer 306 between the display substrate 302 and the counter substrate 304. The display substrate 302 includes a first substrate 308, a first electrode layer 310 formed on the first substrate 308, a thin film transistor 312 deposited on the first substrate 308 and electrically connected to the first electrode layer 310, and a first alignment film 314 deposited on the first electrode layer 310. Wherein the thin film transistor 312 is a thin film transistor formed in the first embodiment and which includes a gate 102, a source/drain 104, an insulating layer 106, and a semiconductor active layer 116. The semiconductor active layer 116 connecting the source/drain 104 may be a ZnO II-VI compound semiconductor layer, and the materials of the other layers can be referred to the first embodiment. Besides, the thin film transistor 312 also includes a semiconductor precursor thin film 108 connected to the semiconductor active layer 116; however, the semiconductor precursor thin film 108 may also be removed.

Referring to FIG. 3 again, a passivation layer 316 may be further deposited between the first electrode layer 310 and the thin film transistor 312. The counter substrate 304 includes a second substrate 318, a second electrode layer 320 formed on the second substrate 318, and a second alignment film 322 deposited on the second electrode layer 320. The first and the second alignment layers 314 and 322 may be rubbing alignment layers, photo alignment layers, or ion alignment layers.

Besides being applied to the active-matrix liquid crystal display in the third embodiment, the thin film transistor in the present invention may also be applied to other types of displays or equipments such as smart card, price tag, inventory tag, solar cell, and large-area sensor array.

In summary, a liquid process is adopted along with a light source of suitable wavelength and energy in the present invention to replace the conventional thermal process. Thus, the process of the present invention can be performed in atmospheric air where only partial heating is required. Accordingly, the process is suitable for manufacturing low-cost, large-size product. Alternatively, a desired pattern may be formed, and therefore no additional photolithography or etching process is required, accordingly the process can be simplified and the fabrication cost can be effectively reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an active layer of a thin film transistor, comprising:
   providing a substrate;
   preparing a semiconductor precursor solution using a liquid process;
   applying the semiconductor precursor solution on the substrate to form a semiconductor precursor thin film; and
   irradiating a portion of the semiconductor precursor thin film with a light source to remove residual solvent in the semiconductor precursor thin film and transform the portion of the semiconductor precursor thin film into an active semiconductor layer having semiconductor property, wherein the semiconductor precursor thin film which is not irradiated by the light source is remained on the substrate.

2. The method as claimed in claim 1, wherein the light source has a wavelength between 5 nm and 750 nm and an energy between 0.01 mj/cm$^2$ and 1200 mj/cm$^2$.

3. The method as claimed in claim 1, wherein the liquid process comprises sol-gel, chemical bath deposition, photochemical deposition, or evenly distributing semiconductor nano particles into solvent.

4. The method as claimed in claim 1, wherein the step of applying the semiconductor precursor thin film comprises spin-coating, inkjet printing, drop-printing, casting, microcontact, micro-stamp, or dipping.

5. The method as claimed in claim 1, further comprising a step of performing a soft baking before irradiating the semiconductor precursor thin film with the light source.

6. The method as claimed in claim 1, further comprising a step of removing the semiconductor precursor thin film not irradiated by the light source after forming the semiconductor active layer.

7. The method as claimed in claim 1, further comprising a step of providing a mask after forming the semiconductor precursor thin film to serve as a mask when irradiating the semiconductor precursor thin film with the light source.

8. The method as claimed in claim 1, wherein the semiconductor precursor thin film comprises an II-VI compound semiconductor precursor.

9. The method as claimed in claim 8, wherein the II-VI compound semiconductor precursor comprises ZnO.

10. The manufacturing method as claimed in claim 1, wherein the substrate comprises Si wafer, glass substrate, ceramic substrate, metal substrate, paper substrate, or plastic substrate.

* * * * *